US009160320B2

(12) United States Patent
Roytman et al.

(10) Patent No.: US 9,160,320 B2
(45) Date of Patent: Oct. 13, 2015

(54) APPARATUS, SYSTEM, AND METHOD FOR VOLTAGE SWING AND DUTY CYCLE ADJUSTMENT

(71) Applicants: Eduard Roytman, Newton Centre, MA (US); Jian Xu, Westborough, MA (US); Rahul Shah, Marlborough, MA (US); Kambiz R. Munshi, Shrewsbury, MA (US); Ronald L. Bedard, Westminster, MA (US); Mahalingam Nagarajan, Grafton, MA (US)

(72) Inventors: Eduard Roytman, Newton Centre, MA (US); Jian Xu, Westborough, MA (US); Rahul Shah, Marlborough, MA (US); Kambiz R. Munshi, Shrewsbury, MA (US); Ronald L. Bedard, Westminster, MA (US); Mahalingam Nagarajan, Grafton, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/035,782

(22) Filed: Sep. 24, 2013

(65) Prior Publication Data

US 2014/0085123 A1   Mar. 27, 2014

Related U.S. Application Data

(63) Continuation of application No. 13/100,669, filed on May 4, 2011, now Pat. No. 8,542,046.

(51) Int. Cl.
*H03M 1/12* (2006.01)
*H03M 1/50* (2006.01)
(Continued)

(52) U.S. Cl.
CPC ............. *H03K 5/086* (2013.01); *H03K 5/1565* (2013.01); *H03M 1/004* (2013.01); *H03M 1/126* (2013.01); *H03M 1/50* (2013.01)

(58) Field of Classification Search
CPC ................................. G03M 1/52; G03M 1/54
USPC .......................................................... 341/164
See application file for complete search history.

(56) References Cited

U.S. PATENT DOCUMENTS 5,032,744 A * 7/1991 Wai Yeung Liu ................ 327/55
5,105,160 A * 4/1992 Summers ........................... 327/7
(Continued)

FOREIGN PATENT DOCUMENTS

JP     2008-227696      9/2008
JP     2010-114875      5/2010
WO    WO-20070024338    2/2007

OTHER PUBLICATIONS

International Search Report and Written Opinion issued for International Patent Application No. PCT/US2012/031970, mailed Dec. 27, 2012, 13 pages.

(Continued)

*Primary Examiner* — Howard Williams
(74) *Attorney, Agent, or Firm* — Blakey, Sokoloff, Taylor & Zafman LLP

(57) ABSTRACT

Described herein are an apparatus, system, and method for compensating voltage swing and duty cycle of a signal on an input-output (I/O) pad of a processor by adjusting the voltage swing and duty cycle of the signal. The apparatus comprises a driver to transmit a signal on an I/O pad, the signal on the I/O pad having a voltage swing and a duty cycle; and an adjustment unit, coupled to the driver, to receive the signal from the I/O pad transmitted by the driver and to generate voltage swing and duty cycle control signals for adjusting the voltage swing and duty cycle of the signal on the I/O pad respectively. Described herein is also an analog-to-digital (A2D) converter for measuring and/or calibrating various signal attributes including current, voltage, and time.

18 Claims, 15 Drawing Sheets

(51) Int. Cl.
*H03K 5/08* (2006.01)
*H03M 1/00* (2006.01)
*H03K 5/156* (2006.01)

(56) References Cited

U.S. PATENT DOCUMENTS

| | | | |
|---|---|---|---|
| 6,762,636 | B1 | 7/2004 | Khawshe |
| 7,051,129 | B2 | 5/2006 | Horowitz et al. |
| 7,307,560 | B2 * | 12/2007 | Shi et al. ................. 341/118 |
| 7,570,704 | B2 | 8/2009 | Nagarajan et al. |
| 7,733,250 | B1 * | 6/2010 | Tsyrganovich ........... 341/118 |
| 7,868,658 | B1 | 1/2011 | Miao |
| 8,089,387 | B2 * | 1/2012 | Baker ....................... 341/155 |
| 8,144,047 | B2 * | 3/2012 | Lin et al. .................. 341/167 |
| 2007/0024338 | A1 | 2/2007 | Shumarayev |
| 2010/0066582 | A1 * | 3/2010 | Park ........................ 341/158 |
| 2010/0123489 | A1 * | 5/2010 | Yan ......................... 327/149 |

OTHER PUBLICATIONS

Notice of Allowance issued for U.S. Appl. No. 13/100,669, mailed May 23, 2013.

Notification Concerning Transmittal International Preliminary Report on Patentability issued for International Patent Application No. PCT/US2012/031970, mailed Nov. 14, 2013, 8 pages.

English Translation of Office Action from corresponding Japanese Patent Application No. 2014-50929, mailed Dec. 24, 2014, 5 pages.

* cited by examiner

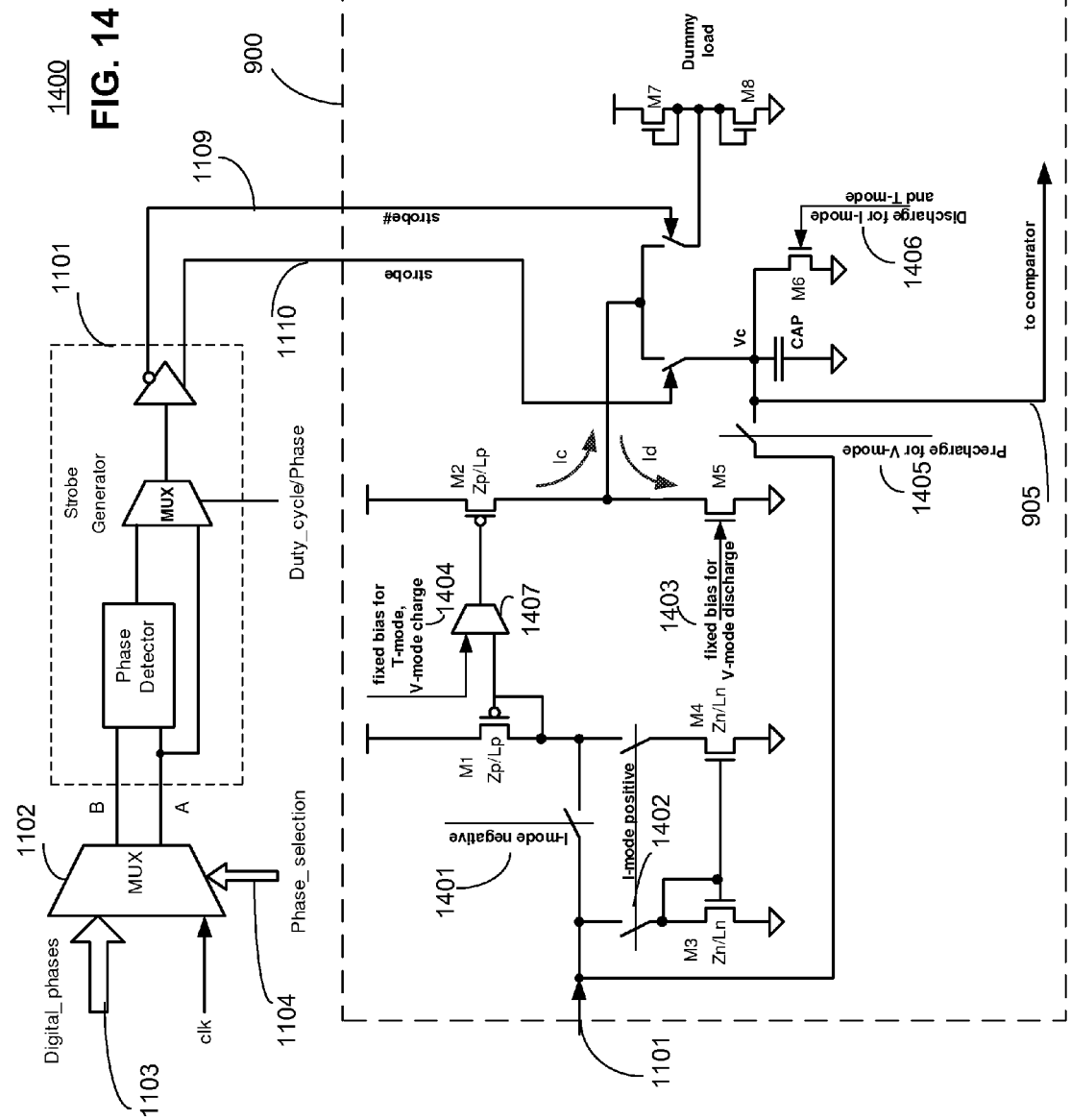

APPARATUS, SYSTEM, AND METHOD FOR VOLTAGE SWING AND DUTY CYCLE ADJUSTMENT

CLAIM OF PRIORITY

The present application is a Continuation of, and claims priority to and incorporates by reference, the corresponding U.S. patent application Ser. No. 13/100,669 filed May 4, 2011, and entitled "AN APPARATUS, SYSTEM, AND METHOD FOR VOLTAGE SWING AND DUTY CYCLE ADJUSTMENT," and issued as U.S. Pat. No. 8,542,046 on Sep. 24, 2013.

FIELD OF THE INVENTION

Embodiments of the invention relate generally to the field of processors. More particularly, embodiments of the invention relate to an apparatus, system, and method for voltage swing and duty cycle adjustments of signals on input-output (I/O) pads of a processor. The embodiments of the invention also relate to an apparatus for measuring various signal attributes including current, voltage, and time.

BACKGROUND

As input-output (I/O) transceivers operate at higher frequencies, voltage and timing margins become smaller and harder to meet for a given design. Furthermore, high degree of random variation (also referred to as within-die variation) in modern process technology results in excessive variations in voltage swing and duty cycle of signals transmitted by the I/O transceivers on transmission media. Identical I/O transceivers (i.e., transceivers with identical designs and transistor sizes) may exhibit different signaling attributes within internal nodes and at the outputs of their respective I/O pads e.g., the voltage swing and duty cycle of a signal generated by a first I/O transceiver of a processor may be different from the voltage swing and duty cycle of another signal generated by a second I/O transceiver of the processor, even when the second I/O transceiver being physically located next to the first I/O transceiver.

Such variability in the voltage swing and duty cycle of signals at the I/O pads result in reduced performance of the processor—performance as measured in terms of overall I/O speeds and satisfaction of I/O specifications of the processor.

Furthermore, characterizing various attributes of such high speed devices (e.g., the devices of the high speed I/Os) require expensive debugging testers. To reduce the cost and test time such high speed devices, on-die processor self-testing measures are applied. Traditional analog to digital (A2D) converters can be used to measure a single analog attribute of a device e.g., current levels of a current source of an I/O transmitter, to characterize the device. However, such A2D converters are unable to measure multiple internal analog and digital attributes of a device e.g., current levels flowing through a node, duty-cycle of a high-speed node, phase difference between two different high-speed nodes, voltage level of a signal on a node.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 14 illustrates transistor level components of the A2D converter, according to another embodiment of the invention.

DETAILED DESCRIPTION

Figure 1:
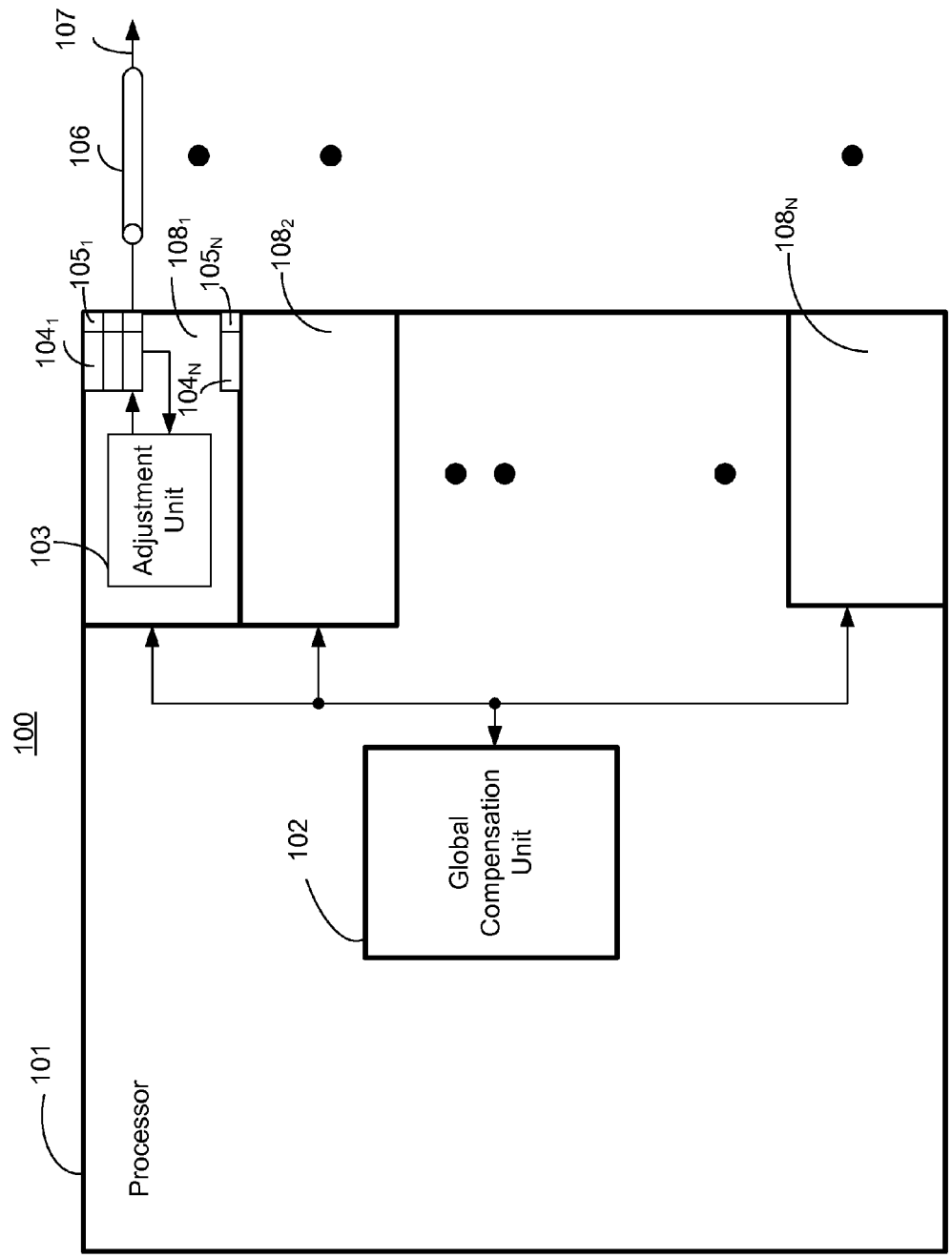
FIG. 1 is a high level view of a processor with a per input-output (I/O) lane voltage swing and duty cycle adjustment unit, according to one embodiment of the invention.

Embodiments of the invention relate to an apparatus, system, and method for voltage swing and duty cycle adjustments of signals on input-output (I/O) pads of a processor. Embodiments of the invention also relate to an apparatus, system, and method for measuring various attributes of device(s) by means of an analog-to-digital (A2D) converter.

In one embodiment, the apparatus comprises an I/O transceiver including a driver to transmit a signal on an I/O pad, the signal on the I/O pad having a voltage swing and a duty cycle. The apparatus also comprises an adjustment unit, coupled to the driver, to receive the signal from the I/O pad transmitted by the driver and to generate voltage swing and duty cycle control signals for adjusting the voltage swing and duty cycle of the signal on the I/O pad. As mentioned in the background section, random variations in devices of the I/O transceivers cause variations in voltage swings and duty cycles of signals on the I/O pads even though the drivers, coupled to the I/O pads, that generate the signals on the I/O pads have identical designs. In one embodiment, the adjustment unit is operable to compensate for such random variations by adjusting both the voltage swing and the duty cycle of signals, for an I/O lane, by generating voltage swing and duty cycle control signals based on the signals on an I/O pad of the I/O lane.

By operating on the signals on the I/O pad, all sources of variation and distortion that cause variation in voltage swing and duty cycle are compensated by the adjustment unit.

An example of a high speed I/O transceiver is the Quick-Path Interconnect® (QPI) developed by Intel Corp. of Santa Clara, Calif. The QPI of a processor operates at clock rates of 2.4 GHz, 2.93 GHz, or 3.2 GHz and may generate signals at the QPI I/O pads of the processor with data rates of 25.6 GB/s. Any random variability in voltage swings and duty cycles between QPI signals of different I/O lanes of the processor, operating at such high data rate, degrade the overall performance of the processor. In one embodiment, the QPI I/O transceiver comprises the adjustment unit which is operable to receive the signals on the I/O pad of the QPI I/O transceiver and to compensate all sources of variation and distortion that cause variation in voltage swing and duty cycle in the signals at the I/O pad.

The term "I/O lane" herein refers to a group of I/O transceivers with data and clock I/O transceivers. For example, a lane may have 21 I/O transceivers (20 for transmitting and receiving data signals, and 1 for clock signal), and a processor may have 20 lanes.

The term "voltage swing" herein refers to a voltage difference between the logical low (Vol) and the logical high (Voh) levels of the signal at the I/O pad. The term "voltage swing adjustment" herein refers to adjusting a voltage level of either the logical low or logical high level of the signal at the I/O pad. The term "adjusting a voltage level" herein refers to raising or lowering the logical low or logical high voltage levels of the signal at the I/O pad.

The term "duty cycle" herein refers to the pulse width of a logical high pulse relative to a logical low pulse in a period of a signal. For example, a signal having a 50% duty cycle refers to a signal with an equal logical high and low pulse widths within the period of the signal i.e., the signal is logical high for half the period of time and logical low for the remaining half of the period of time of the signal.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme, e.g., differential pair, single-ended, etc.

FIG. 1 is a high level view 100 of a processor 101 with a per I/O lane voltage swing and duty cycle adjustment unit 103, according to one embodiment of the invention. In one embodiment, the processor 101 comprises 'N' I/O lanes labeled as $108_{1-N}$. In one embodiment, N=20. So as not to obscure the embodiments of the invention, the embodiments are discussed with reference to the I/O lane $108_1$.

In one embodiment, the I/O lane $108_1$ comprises multiple I/O transceivers $104_{1-N}$ including I/O pads $104_{1-N}$ coupled to corresponding I/O pins $105_{1-N}$. In one embodiment, N=21 i.e., 21 I/O transceivers per I/O lane. In one embodiment, the I/O lane $108_1$ comprises an adjustment unit 103 operable to receive a signal, from an I/O pad of an I/O transceiver (e.g., $104_1$), for transmission to an I/O pin (e.g., $105_1$) and operable to adjust the voltage swing and duty cycle of the signal for transmission. In one embodiment, each I/O pin ($105_{1-N}$) is coupled to a corresponding transmission medium 106. In one embodiment, the transmission medium 106 is a point-to-point interconnect. The signal 107 from the transmission media 106 is received by a receiver (not shown) of another processor (not shown).

In one embodiment, the processor 101 comprises a global compensation unit 102 to compensate for termination impedance and analog bias signals of a driver of the I/O transceiver (e.g., $104_1$). In one embodiment, the adjustment unit 103 begins to adjust the voltage swing and duty cycle of the I/O pad signals for each I/O lane after the global compensation unit 102 completes an initial compensation of the termination impedance and analog bias signals for all I/O pads in all I/O lanes.

Figure 2:
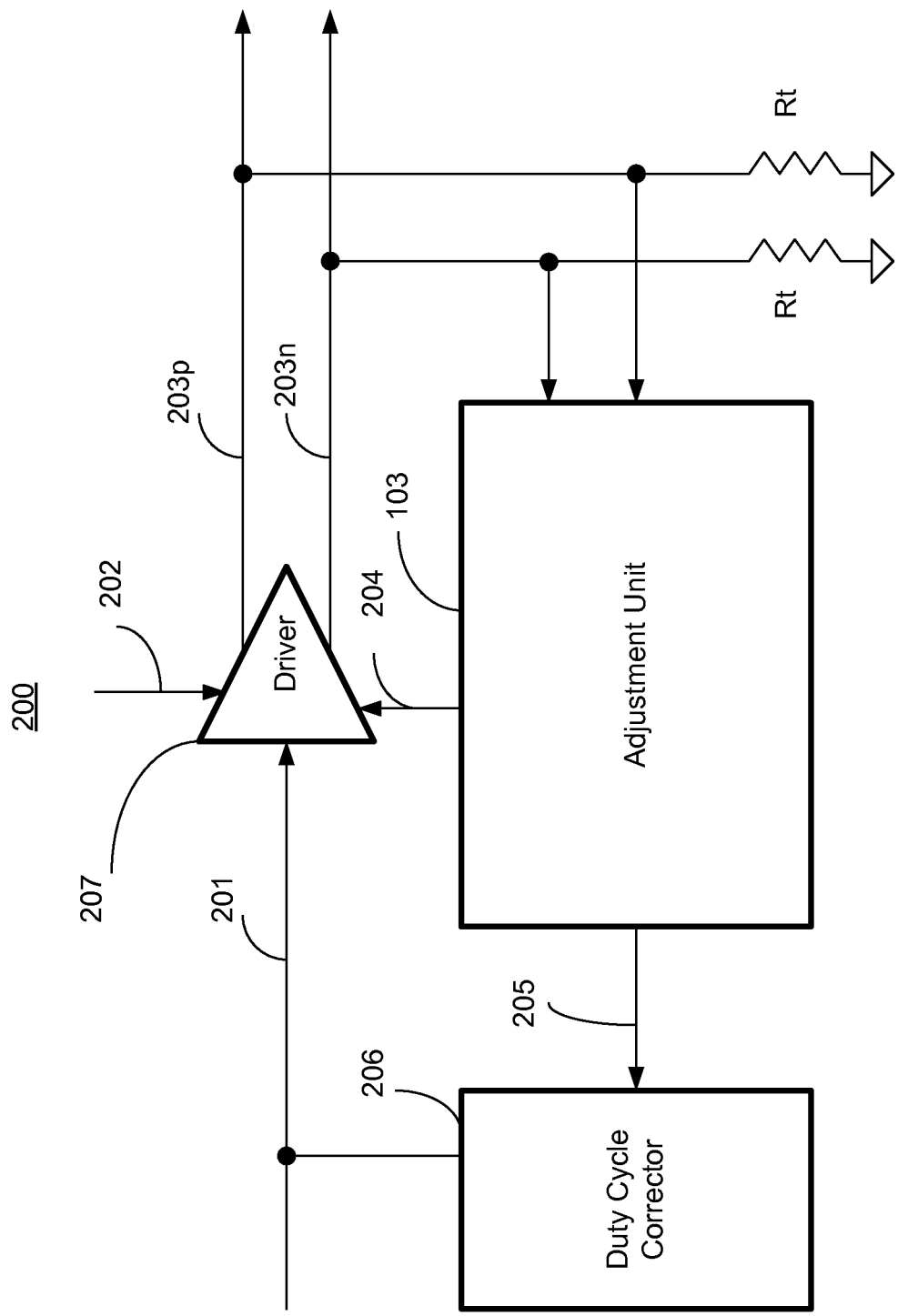
FIG. 2 is a block diagram of an I/O transmitter of the processor comprising a voltage swing and duty cycle adjustment unit, according to one embodiment of the invention.

FIG. 2 is a block diagram 200 of an I/O transceiver (e.g., $104_1$) of the processor 101 coupled to a voltage swing and duty cycle adjustment unit 103, according to one embodiment of the invention. In one embodiment, the I/O transceiver comprises a driver 207 which generates differential output signals 203p and 203n from an input signal 201. So as not to obscure the embodiments of the invention, other components of the transceiver (e.g., $104_1$) such as a pre-driver, a serializer, double pump multiplexer, buffers, clock tree, etc., are not shown.

In one embodiment, the driver 207 receives an analog bias signal 202 to set the driving strength of the driver 207. In one embodiment, the analog bias signal 202 is set by the global compensation unit 102. In one embodiment, the voltage swing of the signals 203p and 203n is adjusted by turning on/off devices of a bias circuit (or generator), in the driver 207, that generates a bias voltage level for a current source of the driver 207 that provides current to the final driving stage, of the driver 207. The final driving stage generates the signals 203p and 203n on the I/O pad. The components that adjust the bias voltage level for the current source are later discussed with reference to FIG. 5.

Referring back to FIG. 2, the adjustment unit 103 receives the differential signals 203p and 203n transmitted by the driver 207 and generates voltage swing control signal 204 and duty cycle control signal 205. In one embodiment, the adjustment unit 103 generates a common mode voltage signal of the two signals 203p and 203n. In one embodiment, the two differential signals 203p and 203n are terminated by termination resistors 'Rt' which are compensated for process, temperature, and voltage variations by the global compensation unit 102.

In one embodiment, the voltage swing control signal 204 is received by the driver 207. In such an embodiment, the voltage swing control signal 204 is received by gates of transistors that control the bias voltage level for a current source that provides current to the final driving stage of the driver 207. In one embodiment, the voltage swing control signal 204 is a bus comprising multiple control signals, each control signal representing a bit code (1 or 0) to turn on/off a transistor in the driver 207. By turning on/off the various transistors in the bias generation circuit of the driver 207 by means of the bit codes of the control signal 204, the voltage swing of the signals 203p and 203n is adjusted. In one embodiment, the bus 204 is thermometer coded. In other embodiments, the bus 204 is binary coded.

In one embodiment, the adjustment unit 103 continues to update the voltage control signal 204 till the voltage swing of the signals 203p and 203n achieves a threshold level. In one embodiment, the threshold level is programmable. In one embodiment, the adjustment unit 103 generates the duty cycle control signal 205 after generating the voltage swing control signal 204 and after the voltage swing of the signals 203p and 203n achieves the threshold level. One reason for adjusting the voltage swing of the signals 203p and 203n prior to adjusting the duty cycle of the signals 203p and 203n is that an adjustment of the voltage swing of the signals 203p and 203n changes the duty cycle of the signals 203p and 203n.

In one embodiment, the I/O transceiver (e.g., 104₁) comprises a duty cycle corrector 206 to adjust the duty cycle of the signal 201 in view of the duty cycle control signal 205. In one embodiment, the duty cycle control signal 205 is a bus having multiple signals, each signal representing a bit code (1 or 0) to turn on/off a transistor in the duty cycle corrector 206. In one embodiment, the bus 205 is thermometer coded. In other embodiments, the bus 205 is binary coded. Sources of duty cycle distortion of signals 203p and 203n include clock tree buffers, double pumped multiplexers, pre-drivers, driver 207, driver termination resistors 'Rt' etc. In the embodiments discussed herein, the duty cycle of the signals 203p and 203n are adjusted by sampling the duty cycle of the signals 203p and 203n at the I/O pads instead of sampling the duty cycle of the to be transmitted signals e.g., signals from a clock tree buffer or any other circuit/unit prior to the driver 207.

By monitoring the output of the driver 207 i.e., the differential signals 203p and 203n on the I/O pads, by the adjustment unit 103, and determining the duty cycle control signal 205 from the monitored signals 203p and 203n, all sources of duty cycle distortion are accounted for by the duty cycle control signal 205. In one embodiment, the duty cycle corrector 206 corrects the duty cycle of the to be transmitted signal 201 in view of the duty cycle control signal 205 to compensate for duty cycle distortions of signals 203p and 203n at the I/O pads.

Figure 3:
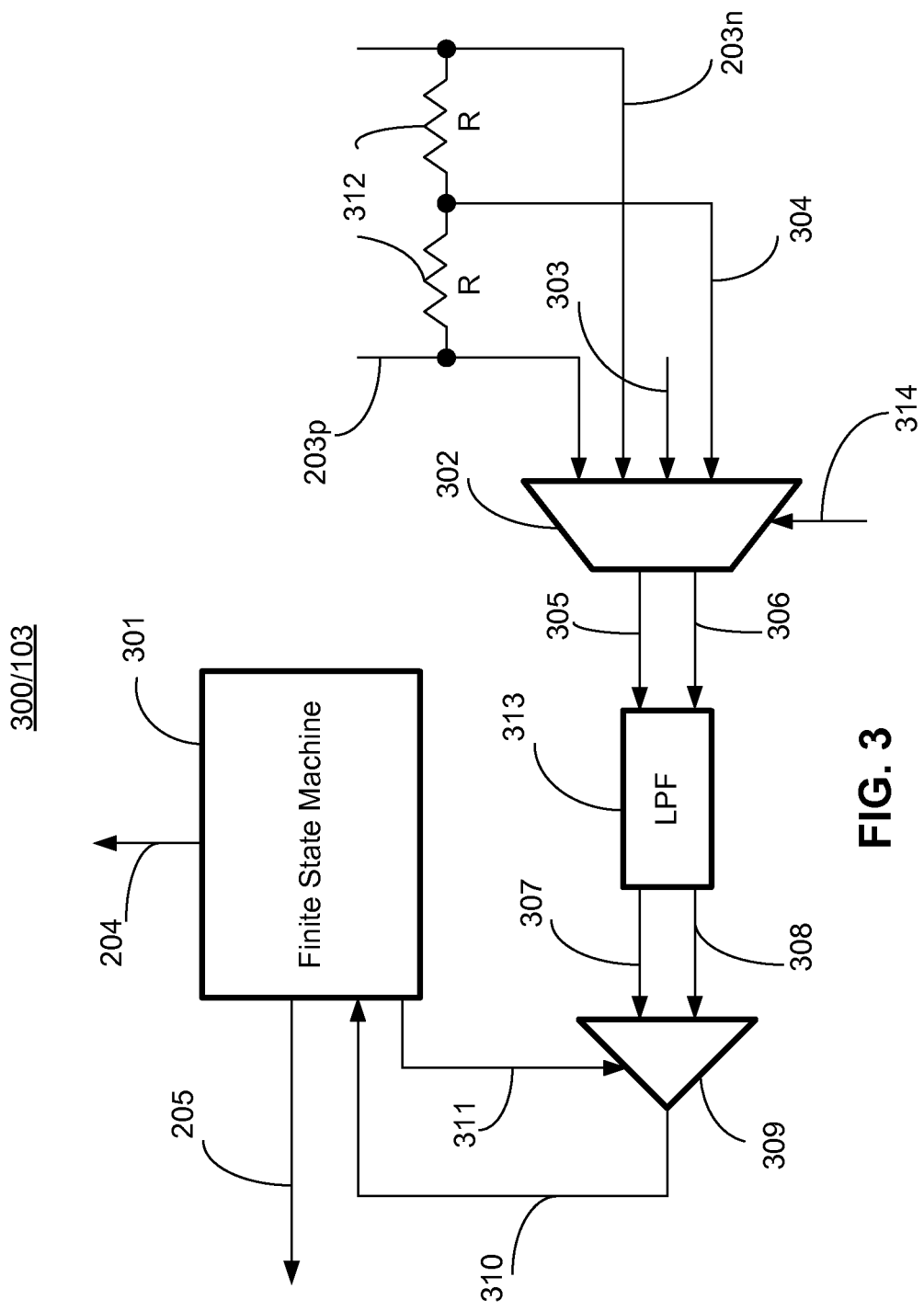
FIG. 3 is a block diagram of the components of the adjustment unit for adjusting voltage swing and duty cycle of signals on an I/O pad, according to one embodiment of the invention.

FIG. 3 is a block diagram of the components of the adjustment unit 300/103 for adjusting voltage swing and duty cycle of signals on an I/O pad, according to one embodiment of the invention. In one embodiment, the adjustment unit 300/103 comprises a multiplexer 302. In one embodiment, the multiplexer 302 multiplexes signals including differential signals 203p and 203n from the driver 207, a reference voltage signal 303, and a common mode voltage signal 304. In one embodiment, the common mode voltage signal 304 is generated by averaging the signals 203p and 203n by means of resistors 312 of equal resistance R. In one embodiment, the value of the resistor is 5 KOhms.

In one embodiment, the reference voltage signal 303 is generated by a voltage divider (not shown). In one embodiment, the voltage divider is a resistor ladder. In another embodiment, the reference voltage signal 303 is generated by a band-gap circuit (not shown). In one embodiment, the reference voltage signal 303 is a DC voltage signal of 250 mV. In one embodiment, the multiplexer 302 is controlled by a select signal 314. In one embodiment, the select signal 314 causes the multiplexer 302 to select the reference voltage signal 303 and the common mode voltage signal 304 for generating the voltage swing control signal 204. In one embodiment, the select signal 314 causes the multiplexer 302 to select 203n and 203p for generating the duty cycle control signal 205.

In one embodiment, the output of the multiplexer 302 is a differential output comprising of signals 305 and 306 that correspond to either both the reference voltage signal 303 and the common mode voltage signal 304 or signals 203n and 203p. In one embodiment, the outputs 305 and 306 of the multiplexer 302 are filtered by a low pass filter (LPF) 313. In one embodiment, the LPF 313 is bypassed by a bypassing logic (not shown) when the select signal 314 selects the reference voltage 303 and the common mode voltage signal 304 for generating the voltage swing control signal 204. In such an embodiment, the outputs of the multiplexer 305 and 306 are directly input to a comparator 309.

Figure 4A:
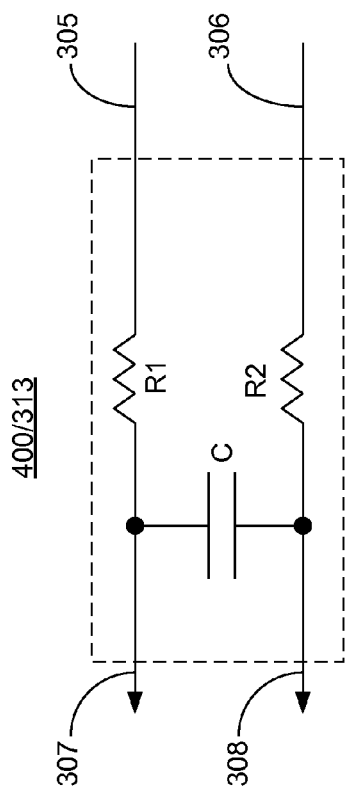
FIG. 4A is a circuit level diagram of a low pass filter of the adjustment unit, according to one embodiment of the invention.

FIG. 4A illustrates a circuit level diagram 400 of the LPF 313 of the adjustment unit 103, according to one embodiment of the invention. In this embodiment, the LPF 313 is a differential LPF including a capacitor C connected between the resistors R1 and R2. In one embodiment, the values of the resistors R1 and R2 are 5 KOhms each, the capacitor C is 1.6 pF, and the 3 dB cut-off frequency of the differential LPF is 10 MHz. Higher or lower values of the 3 dB cut-off frequencies can be designed for the differential LPF to optimize between accuracy and lower residual noise from the differential LPF on the one hand and design area on the other hand.

Figure 4B:
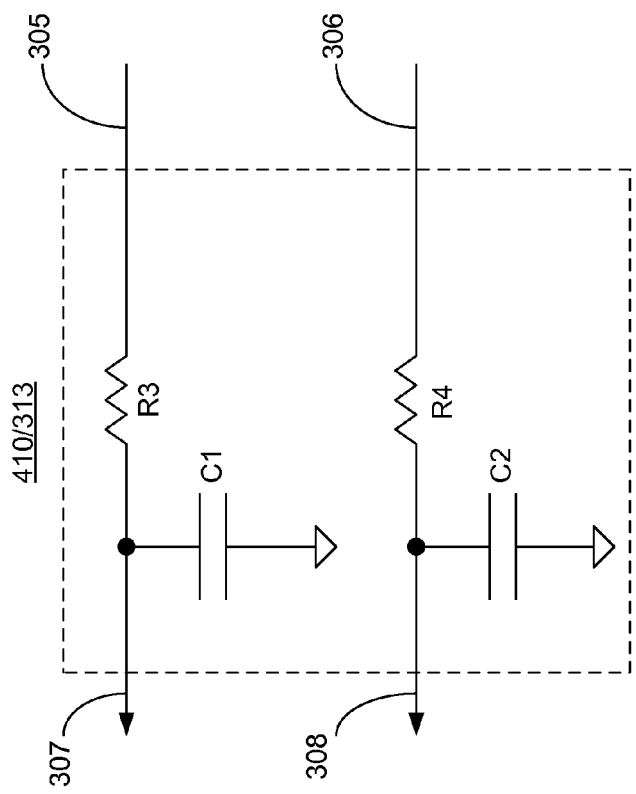
FIG. 4B is a circuit level diagram of a low pass filter of the adjustment unit, according to another embodiment of the invention.

FIG. 4B illustrates a circuit level diagram 410 of the LPF 313 of the adjustment unit 103, according to another embodiment of the invention. In this embodiment, the LPF 313 comprises independent RC filters for each output signals 305 and 306 of the multiplexer 302. In one embodiment, the values of the resistors R3 and R4 are 5 KOhms each, the value of the capacitors C1 and C2 are 3.2 pF each, and the 3 dB cut off frequency of the LPF 410/313 is 10 Mhz. Higher or lower values of the 3 dB cut-off frequencies can be designed for the LPF to optimize between accuracy and lower residual noise from the LPF on the one hand and design area on the other hand.

Referring back to FIG. 3, in one embodiment the adjustment unit 103 further comprises a comparator 309 which compares the filtered output 307 and 308 with one another. The filtered output s 307 and 308 correspond to signals 305 and 306 respectively. In one embodiment, the comparator 309 generates an output signal 310 in response to comparing the signals 307 and 308. In one embodiment, the comparator 309 is an offset cancellation comparator which cancels input offset to reduce errors when comparing the input signals 307 and 308 with one another. In one embodiment, the comparator 309 receives a clock signal 311 to sample the output 310 of the comparator 309. In such an embodiment, the sampling means are integrated within the comparator 309. In other embodiments, the sampling means (not shown) are separate from the comparator 309. In one embodiment, the sampling means comprises a flip flop or a latch. In other embodiments, other types of sampling means may be used.

In the embodiments discussed herein, the comparator 309 is a common comparator in the feedback loop (driver 207→adjustment unit 103→driver 207, and driver 207→adjustment unit 103→duty cycle corrector 206→driver 207) for adjusting both voltage swing and duty cycle of the signals 203p and 203n on the I/O pads. Having the common comparator 309 for adjusting both voltage swing and duty cycle of the signals 203p and 203n reduces the active area of silicon because a single common comparator 309 uses less silicon area than two different comparators for adjusting voltage swing and duty cycle of the signals 203p and 203n respectively. The common comparator 309 also reduces residual I/O lane to I/O lane variability in the voltage swings and duty cycles because the same comparator is used for adjusting both the voltage swings and duty cycles of the signals on the I/O pads.

In one embodiment, the adjustment unit 103 further comprises a finite state machine (FSM) 301. In one embodiment, when the output 310 of the comparator 309 switches (from logical low level to logical high level or vice versa), the FSM 301 determines, based on the current mode of operation, whether the voltage swing of the signals 203p and 203n reached the voltage swing threshold or whether the duty cycle of the signals 203p and 203n is adjusted to the target percentage. In one embodiment, the target percentage for the duty cycle is 50%.

In the embodiments discussed herein, the FSM 301 is a common FSM for generating control signals for both voltage swing and duty cycle adjustment. Having a common FSM 301 reduces overall silicon area and power consumption of the processor 101. The FSM 301 also operates at a frequency less than the clock frequency of the I/O transceiver $108_1$. In one embodiment, the FSM 301 operates at a clock frequency which is ¼ of the clock frequency of the I/O transceiver $104_1$. In such an embodiment, the slow FSM 301, relative to the clock frequency of the I/O transceiver $104_1$, consumes less power supply and has relaxed timing constraints. The term "timing constraints" refers to setup and hold timing requirements. In one embodiment, the FSM 301 output comprises the voltage swing control signal 204, duty cycle control signal 205, and the comparator sampling clock signal 311. In one embodiment, the select signal 314 of the multiplexer 302 is also generated by the FSM 301. The state diagram of the FSM 301 is discussed later with reference to FIG. 7.

Figure 5:
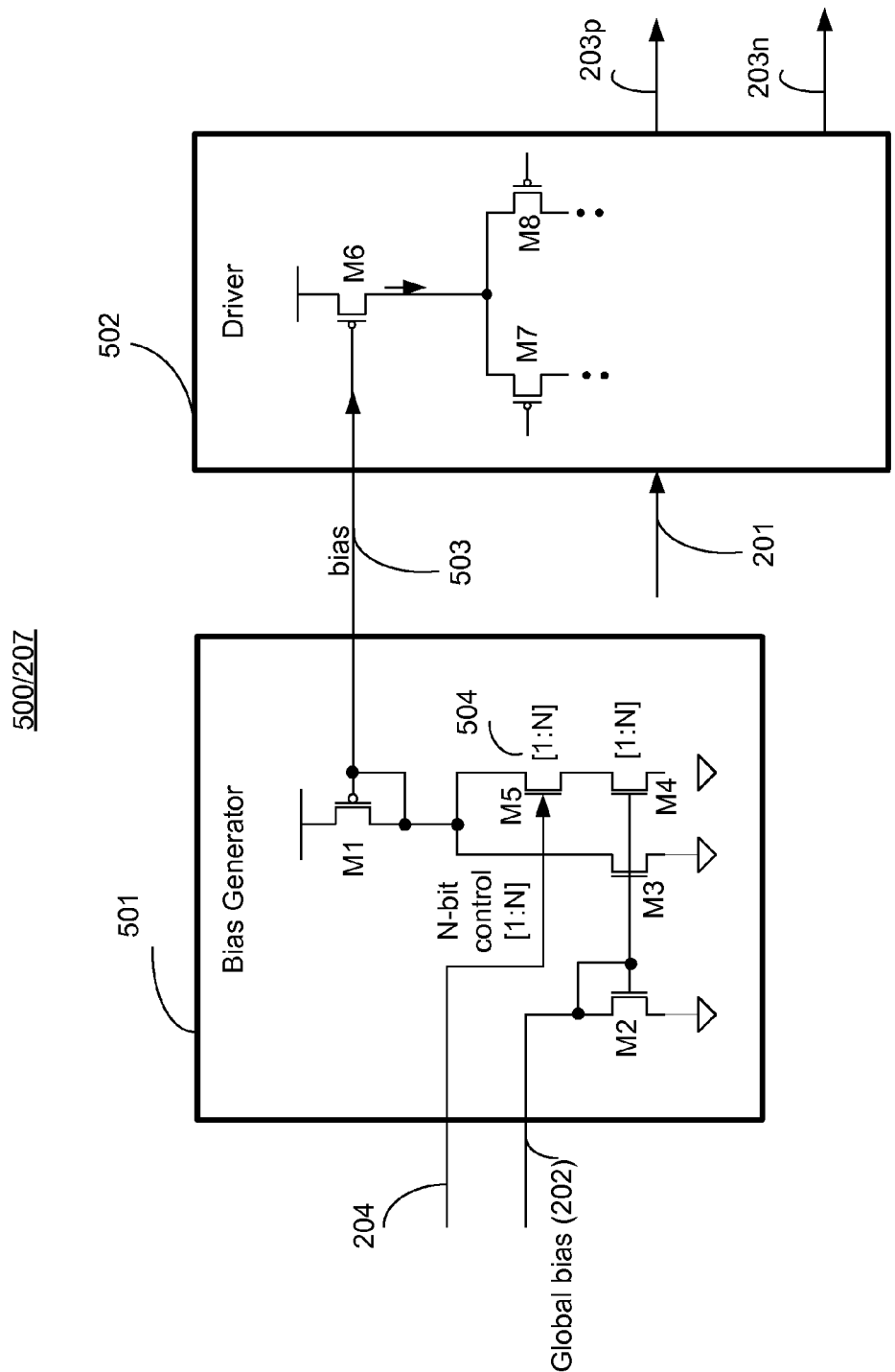
FIG. 5 illustrates components of an I/O driver for adjusting voltage swing of a signal for transmission by the I/O driver, according to one embodiment of the invention.

FIG. 5 illustrates a high level block diagram of the I/O driver 500/207 for adjusting voltage swing of the signals 203p and 203n at the I/O pad, according to one embodiment of the invention. So as not to obscure the embodiments of the invention, a high level block diagram is shown to illustrate that the voltage swing control signal 204 from the adjustment unit 103 is used to adjust the bias level of the signal 503 which in turn adjusts the voltage swing of the signals 203p and 203n.

In one embodiment, the driver 207 comprises a bias generator 501 to provide a bias signal to the driving stage 502. In one embodiment, the bias generator 501 receives a reference bias signal 202 to generate the bias signal 503. In one embodiment, the reference bias signal 202 is the global bias signal generated by the global compensation unit 102.

In one embodiment, the bias generator 501 comprises a current mirror including transistors M1-M5 to generate the bias signal 503 from the reference bias signal 202. In one embodiment, the voltage control signal 204 adjusts the level of the bias signal 503 by turning on/off transistors M5 [1:N]. The term 'N' indicated on the transistor 504 implies more than one identical transistor in parallel to one another. As mentioned above, the voltage control signal 204 is a bus having multiple signals, each signal representing a bit code to turn on/off one of the 'N' transistors 504 to adjust the DC level of the bias signal 503.

In one embodiment, the driver 500/207 comprises a driving stage 502 which receives the input data 201 and outputs a differential data 203p and 203n for transmission to an I/O pad (not shown). In one embodiment, the driving stage 502 is a differential amplifier with ground termination resistors (shown as 'Rt' in FIG. 2), wherein the differential amplifier is biased by a current source M6 controlled (i.e., biased) by the bias signal 503, and wherein the transistors M7 and M8 receive the input signal 201 as complementary signals.

In one embodiment, as the number of transistors 504 are turned on by the voltage swing control signal 204, the level of the bias signal 503 moves farther from the supply level of the PMOS device M7 in the current-mode driving stage 502 to cause the signals 203p and 203n to have a higher drive current and as a result higher voltage swing generated on resistors Rt. In one embodiment, as the number of transistors 504 are turned off by the voltage swing control signal 204, the level of the bias signal 503 moves closer to the supply voltage level of the PMOS device M7 in the current-mode driving stage 502 to cause the signals 203p and 203n to have a lower drive current and as a result lower voltage swing generated on resistors Rt. A person skilled in the art would realize that there are many ways of influencing the bias level of signal 503 by means of the voltage swing control signal 204. All such alternatives are contemplated in these embodiments.

Figure 6:
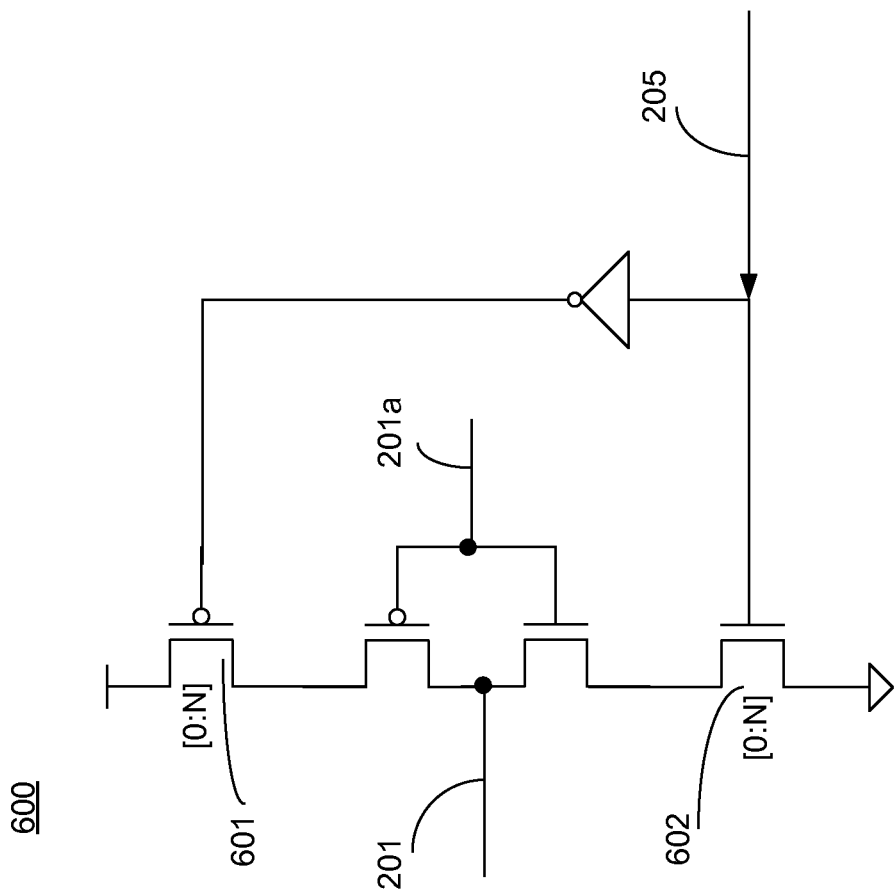
FIG. 6 illustrates components of a duty cycle corrector for adjusting duty cycle of a signal for transmission by the I/O driver, according to one embodiment of the invention.

FIG. 6 illustrates components 600 the duty cycle corrector 206 for adjusting duty cycle of a signal 201 for transmission by the I/O driver 207, according to one embodiment of the invention. In one embodiment, the duty cycle corrector 206 comprises a current starved inverter 600. In one embodiment, the duty cycle control signal 205 from the adjustment unit 103 controls the strength of the current starved inverter 600. By controlling the strength of the transistors 601 and 602, of the current starved inverter 600, the duty cycle of the signal 201 is adjusted. In one embodiment, the current starved inverter 600 receives a signal 201a which is inverted and delayed to generate signal 201.

Figure 7:
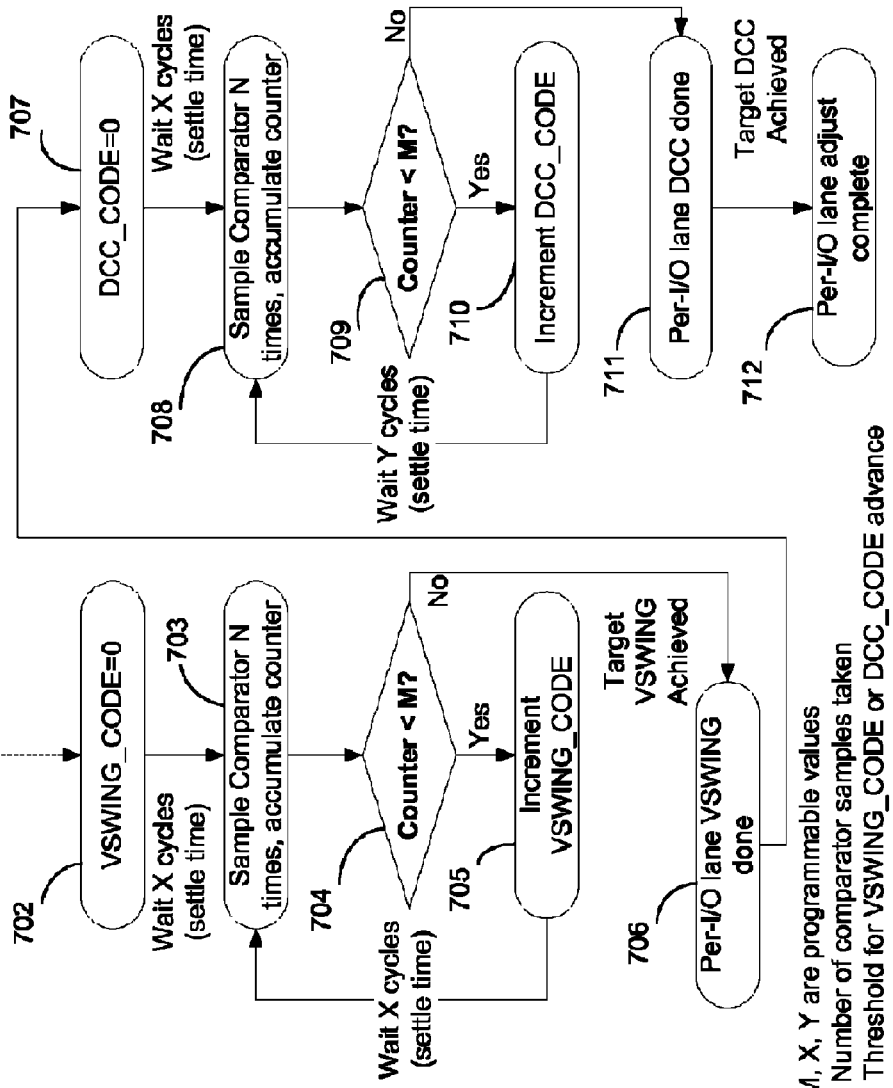
FIG. 7 illustrates a state diagram of a finite state machine (FSM) of the adjustment unit for generating control signals to adjust voltage swing and duty cycle of a signal, according to one embodiment of the invention.

FIG. 7 illustrates a state diagram or flowchart 700 of the FSM 301 of the adjustment unit 103 for generating control signals 204 and 205 to adjust voltage swing and duty cycle of signals 203p and 203n, according to one embodiment of the invention. The state diagram 700 is illustrated with reference to FIGS. 1-6.

In one embodiment, the FSM 301 begins to operate after system reset 701. In one embodiment, system reset 701 is any one of a hard reboot, soft reboot, and wakeup after sleep mode. In one embodiment, at block 702 the FSM 301 begins to generate voltage swing control signal 204 by setting the code (i.e., all bits) of the signal 204 to zero. The length of the code depends on the granularity required for adjusting the voltage swing of signals 203p and 203n. After the multiplexer 302 selects the reference voltage signal 303 and the common mode signal 304, and the comparator 309 compares them (i.e., either the filtered version 307 and 308 or the unfiltered bypassed version of signals 305 and 306), the FSM 301 at block 703 samples the output of the comparator 309 by means of a sampling signal 311, according to one embodiment of the invention. In one embodiment, a counter value is incremented by the FSM 301 after every sampling operation of the comparator output 310. The logic gates including the counter that form the FSM 301 are not disclosed so as not to obscure the embodiments of the invention.

At block 704, the FSM 301 compares the counter value with a predetermined voltage swing threshold value M, according to one embodiment of the invention. In one embodiment, if the counter value is below the value of M, then the FSM 301 at block 705 adjusts the voltage swing control signal 204 to cause the driver 207 to raise the voltage level of the output signals 203p and 203n. In one embodiment, the comparator 309 then compares a new common mode voltage signal 304 with the reference signal 303. In one embodiment, the output of the comparator 309 is then sampled again at block 703. After sampling the output 310 of the comparator 309, the counter value is incremented and compared with the predetermined voltage swing threshold M at block 704, according to one embodiment of the invention.

In one embodiment, the process of raising the voltage level of the output signals 203p and 203n, by means of the driver 207 which receives the voltage swing control signal 204, is performed till the counter value exceeds the predetermined voltage swing threshold value M. At that point, the FSM 301 transfers control to block 706 to signal a completion of the voltage swing adjustment operation of the signals 203p and 203n, according to one embodiment of the invention. In one embodiment, the FSM 301 then adjusts the duty cycle of the signals 203p and 203n. In one embodiment, the voltage control signal codes 204 are stored in a register.

In one embodiment at block 707, the FSM 301 generates the duty cycle control signal 205 by setting the code (i.e., all bits) of the signal 205 to zero. The length of the code depends on the granularity for adjusting the duty cycle of signals 203p and 203n. After the multiplexer 302 selects the signals 203p and 203n from the I/O pads, and the comparator 309 compares the filtered versions 307 and 308 of the signals 203p and 203n, the FSM 301 at block 708 samples the output 310 of the comparator 309 by means of the sampling signal 311, according to one embodiment of the invention. In one embodiment, a counter value is incremented by the FSM 301 after every sampling of the comparator output 310. In one embodiment at block 709, a determination is made whether the counter value is above a predetermined threshold M. In this embodiment, M corresponds to a value that results in the target duty cycle. In one embodiment, the target duty cycle is 50%.

If the counter value is below the value of M, then the FSM at block 710 adjusts the code of the duty cycle control signal 205 to cause the duty cycle corrector 206 to increase the duty cycle of signal 201 and thus of the output signals 203p and 203n, according to one embodiment of the invention. In one embodiment, the comparator 309 then compares the output signals 203p and 203n with one another. The output of the comparator 309 is then sampled again at block 708. As discussed with reference to FIG. 3, the comparator 309 may sample the output of the comparator 309 within the comparator block 309, or a separate sampling means (not shown) may sample the output 310 of the comparator 309 before the signal 310 is input to the FSM 301.

Referring back to FIG. 7, in one embodiment after sampling the output 310 of the comparator 309, the counter value is incremented and compared with the predetermined threshold M at block 709. In one embodiment, the counter of the FSM 301 is the same counter that is used at blocks 703 and 704.

In one embodiment, the process of increasing the duty cycle of the output signals 203p and 203n, by means of the duty cycle control signal 205 and the duty cycle corrector 206, is performed till the counter value exceeds the predetermined threshold value M. At that point, the FSM 301 transfers control to block 711 to signal a completion of duty cycle adjustment of the signals 203p and 203n, according to one embodiment of the invention. In one embodiment, the duty cycle signal codes 205 are stored in a register. In one embodiment, the FSM transfers control to block 712 to indicate that both the voltage swing adjustment and the duty cycle adjustment is complete.

While the embodiments of the state diagram 700 are illustrated by increasing the voltage swing from an initial setting, it is contemplated that the FSM 301 includes all necessary logic to decrease the voltage swing from an initial setting and/or to both increase and decrease the voltage swings of the signals 203p and 203n to bring the voltage swings of the signals 203p and 203n to the target voltage swing level. Similarly, it is contemplated that in one embodiment the FSM 301 includes all necessary logic to decrease the duty cycle from an initial setting and/or to both increase and decrease the duty cycles of the signals 203p and 203n to bring the duty cycles of the signals 203p and 203n to the target duty cycle level.

Figure 8:
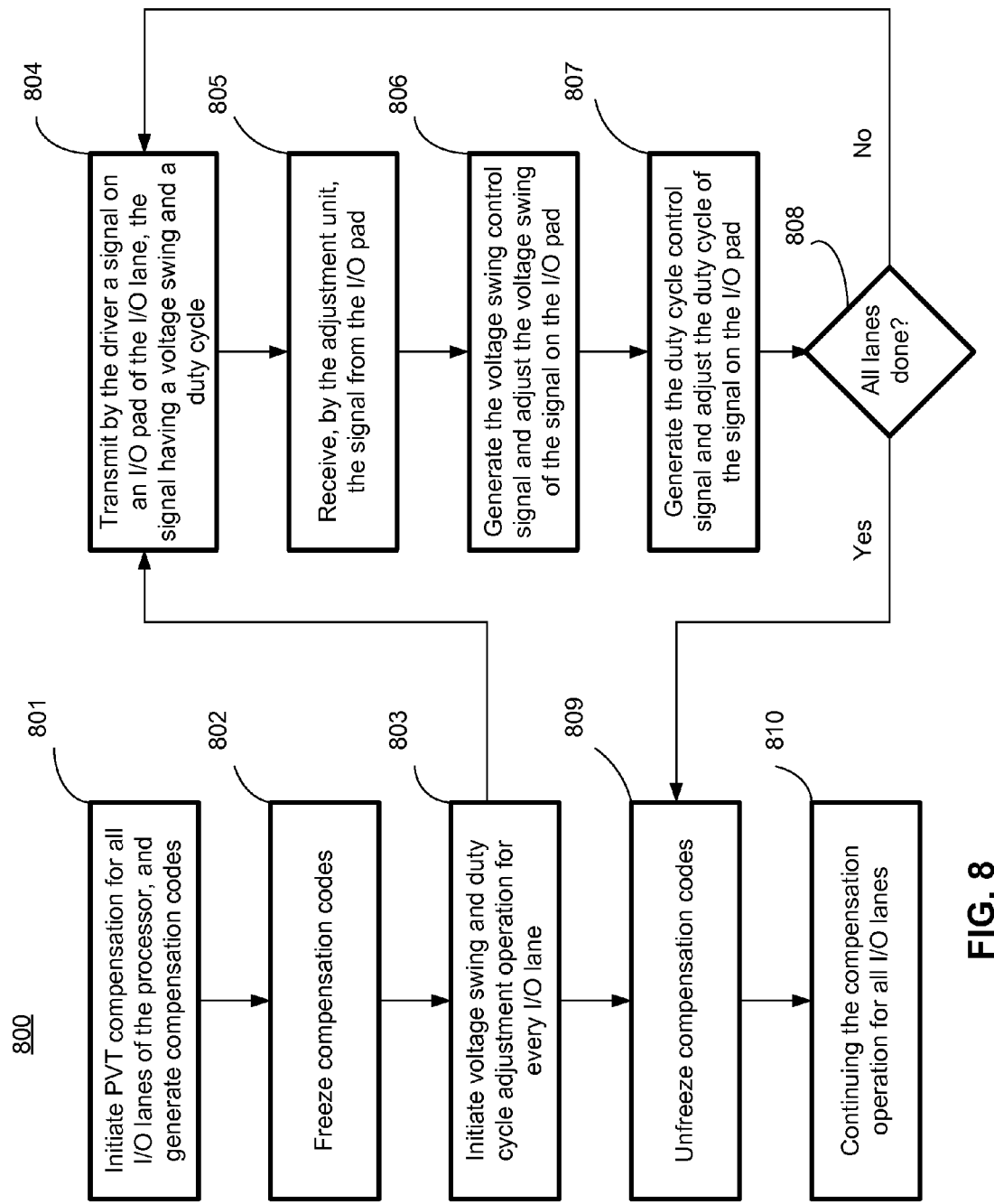
FIG. 8 illustrates a method flowchart for adjusting voltage swing and duty cycle of a signal for transmission by the I/O driver, according to one embodiment of the invention.

FIG. 8 illustrates a method flowchart 800 for adjusting voltage swing and duty cycle of a signal for transmission by the I/O driver 207, according to one embodiment of the invention. The flowchart 800 is illustrated with reference to FIGS. 1-7.

At block 801, the global compensation logic 102 initiates the process, voltage, and temperature compensation of termination impedance and bias voltage/current for all I/O lanes $108_{1-N}$ of the processor 101. The compensation process results in generating of compensation codes for termination impedance and bias voltage/current. At block 802, after completing the compensation process, the global compensation logic 102 freezes the compensation codes for termination impedance and bias voltage/current for all I/O lanes $108_{1-N}$ of the processor 101.

At block 803, the processor 101 initiates the adjustment of voltage swing and duty cycle of signals on the I/O pads for each I/O lane $108_{1-N}$ of the processor 101. Blocks 804-808 of the flowchart 800 summarize the high level operations of the adjustment unit 103. Details of how the voltage swing and duty cycle control signals are generated are discussed above with reference to FIG. 5.

Referring back to FIG. 8, at block 804 the driver 207 transmits signals 203p and 203n on an I/O pad of an I/O lane (e.g., 1080, wherein the signals 203p and 203n have a voltage swing and a duty cycle. At block 805, the adjustment unit 103 receives the signals 203p and 203n to generate voltage swing and duty cycle control signals 204 and 205 respectively. At block 806, the adjustment unit 103 first generates the voltage swing control signal 204. The driver 207 receives the voltage swing control signal 204 to adjust the voltage swing of the signals 203p and 203n. At block 807, the adjustment unit 103 generates the duty cycle control signal 205 after completing the voltage swing adjustment of the signals 203p and 203n. The duty cycle corrector 206 receives the duty cycle control signal 205 to adjust the duty cycle of the signals 203p and 203n.

The process of adjusting the voltage swing and the duty cycle is repeated for all remaining I/O lanes $108_{2-N}$. At block 808, a determination is made whether voltage swing and duty cycle is corrected for all I/O lanes $108_{1-N}$. If any I/O lane still needs voltage swing and duty cycle adjustment, the process from blocks 804 to 808 continues. Upon completion of the adjustment of voltage swing and duty cycle for all I/O lanes $108_{1-N}$, the compensation codes are unfrozen at block 809. The term "unfrozen" means that the compensation codes are allowed to change. At block 810, the global compensation unit 102 continues to compensate termination impedance and bias voltage/current for all I/O lanes $108_{1-N}$ of the processor 101 for process, voltage, and temperature.

Figure 9A:
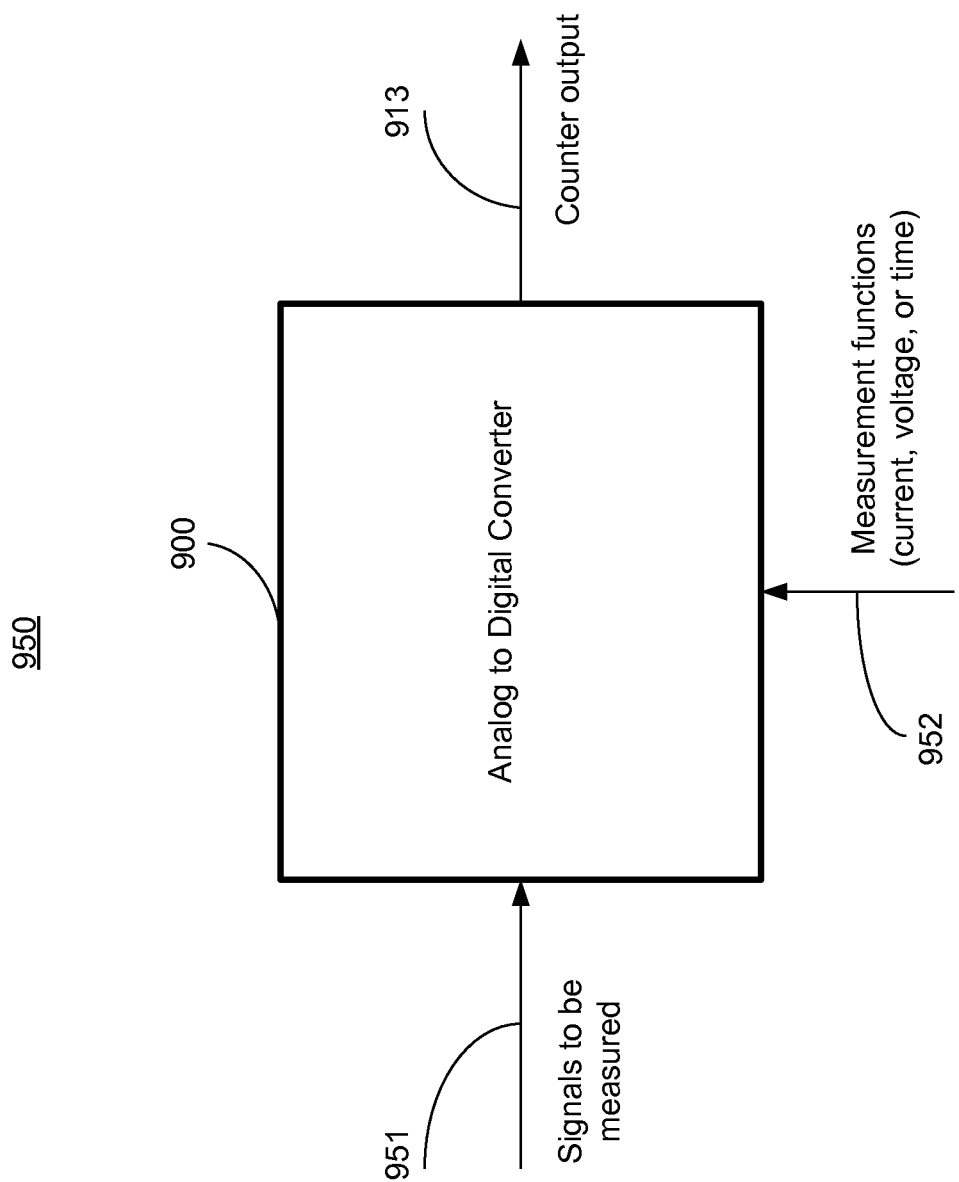
FIG. 9A illustrates a logical view of an analog-to-digital (A2D) converter for measuring various signal attributes including current, voltage, and time, according to one embodiment of the invention.

FIG. 9A illustrates a logical view 950 of an analog-to-digital (A2D) converter 900 for measuring various signal attributes including current, voltage, and time, according to one embodiment of the invention. In one embodiment, the A2D converter 900 receives signal 951 to be measured by the A2D converter. The term "measure" herein refers to converting an analog to a corresponding digital counter value. In one embodiment, the A2D converter converts the signal 951 to a corresponding counter value 913. In one embodiment, the signal 951 is a current through a node, a voltage on a node, or a time domain signal having a pulse width. In one embodiment, the A2D converter 900 is operable to receive an operational signal 952 which configures the A2D converter 900 to implement one of the three distinct measurement functions—current measurement, voltage measurement, or time measurement.

In the embodiments discussed herein, the A2D converter 900 is operable to perform three distinct measurement functions that allow the A2D converter 900 to measure delay locked loop (DLL) phase separation, measure phase interpolator (PI) phase separation, measure duty cycle of a clock signal, calibrate and measure reference voltages, calibrate and measure reference currents etc.

Figure 9B:
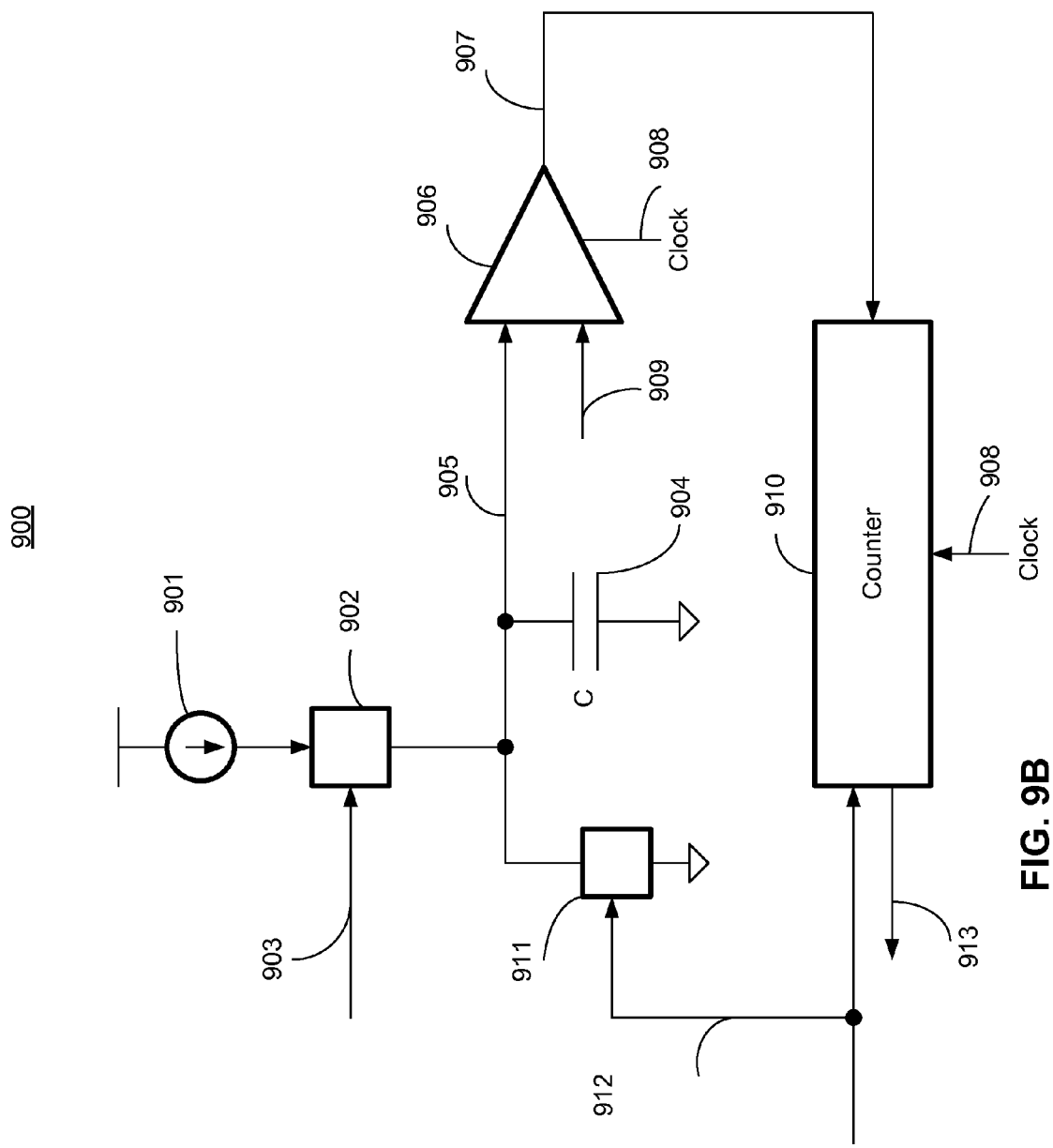
FIG. 9B illustrates components of the A2D converter for measuring various signal attributes, according to one embodiment of the invention.

FIG. 9B illustrates high level components of A2D converter 900 for measuring various signal attributes, according to one embodiment of the invention. In one embodiment, the A2D converter 900 comprises an integrating capacitor 904, a comparator 906, and a counter 910. In one embodiment, the integrating capacitor 904 comprises two terminals. The first terminal of the integrating capacitor 904 is node 905 which is electrically connected as input to the comparator 906. The term "node 905" is herein interchangeably used as "signal 905" to refer to the signal on that node. The second terminal of the integrating capacitor 904 is a ground terminal. In one embodiment, the integrating capacitor 904 is an on-die capacitor having a capacitance C. In one embodiment, the value of C is 5 pF.

In one embodiment, the comparator 906 also receives a reference voltage signal 909. In one embodiment, the reference voltage signal 909 is generated from a voltage divider. In one embodiment, the reference voltage signal 909 is generated by a band-gap circuit. In one embodiment, the reference voltage signal 909 is a programmable signal wherein the levels of the reference voltage signal 909 can be adjusted according to the signal to be measured by the A2D converter 900.

In one embodiment, the comparator 906 is an offset cancellation comparator which is capable of cancelling any input offset in the signals 905 and 909 to reduce residual error in the output 907 of the comparator 906. In one embodiment, the output 907 of the comparator 906 is input to the counter 910 and causes the counter 910 to stop counting when the output 907 trips. The term "trip" herein refers to a signal transitioning from a logical low level to a logical high level or vice versa.

In one embodiment, the comparator 906 receives a clock signal 908 for sampling the output of the comparator 906 before it is input to the counter 910. In such an embodiment, the output 907 of the comparator 906 is a sampled output i.e., sampled by the clock signal 908. In one embodiment, the counter 910 and the comparator 906 receive the same clock signal 908.

In one embodiment, the A2D converter 900 is operable to inject a variable amount of charge on the node 905 of the integrating capacitor 904 during a clock cycle of a clock signal 903. The A2D converter 900 then counts (up or down), by means of the counter 910, the cycles it takes for the node 905 of the capacitor 904 to reach a target voltage level 909 (also referred to as the reference voltage signal) from a known initial state.

In one embodiment, the counter 910 is a count-up counter that begins to count from zero and up in response to a start count (or reset) signal 912. In one embodiment, the counter 910 is a count-down counter that begins to count down from a predetermined count value to zero in response to the start count (or reset) signal 912. In one embodiment, when the start count signal 912 is asserted (or de-asserted), the node 905 is discharged through the device (also called the second switch) 911 to set initial conditions of the integrating capacitor 904.

In one embodiment, once the capacitor node 905 reaches the target voltage level 909, the output 907 of the comparator 906 trips and stops the counter 910 from counting. The size of the counter 910 depends on the type of accuracy with which to measure a signal or the accuracy of converting the analog signal to its digital version.

As mentioned above, in the embodiments discussed herein regarding the A2D converter 900, three distinct measurement functions are implemented in a single A2D converter 900.

The first measurement function is the integrating current function that allows the A2D converter 900 to measure current through a node. In one embodiment, the A2D converter 900 comprises a current source 901 to implement the first measurement function. As later discussed with reference to FIG. 10, in one embodiment, the current source 901 is coupled to a measuring node by means of a current mirror, wherein the A2D converter is operable to measure the current through the measuring node. In this embodiment, the signal 952 of FIG. 9A causes the to be measured current to flow from current source 901 to the capacitor node 905, and also causes a clock signal 903 to periodically switch on and off the first switch 902. In this embodiment, the counter output 913 is inversely proportional to the current from the current source 901.

Referring back to FIG. 9, the second measurement function is an integrating time per cycle function that allows the A2D converter 900 to measure duty cycle and phase of a time domain signal 903. In one embodiment, the first switching device 902 is used to implement the second measurement function. In this embodiment, the signal 952 of FIG. 9A causes a fixed current to flow from the current source 901 to the node 905, and also causes the signal to be measured to couple to 903. In this embodiment, the counter output 913 is inversely proportional to the pulse width of the signal 903 received by the first switching device 902. In this embodiment, the first switching device 902 remains on, to allow the current source 901 to charge the node 905, during the pulse width of the signal 903.

The third measurement function is the voltage measurement function that allows the A2D converter 900 to measure a voltage on the node 905 of the integrating capacitor 904 relative to an initial voltage level on the node 905. In one embodiment, the A2D converter 900 comprises a switching mechanism to switch off devices 902 and 911 and directly couple a signal, whose voltage is to be measured, to the node 904. In this embodiment, the signal 952 of FIG. 9A causes a fixed current to flow from the current source 901 to the capacitor node 905, and also causes the signal 903 to keep the first switch 902 on. In this embodiment, the voltage to be measured is coupled to node 905. In this embodiment, the counter output 913 is directly proportional to the voltage on the node 905.

Figure 10:
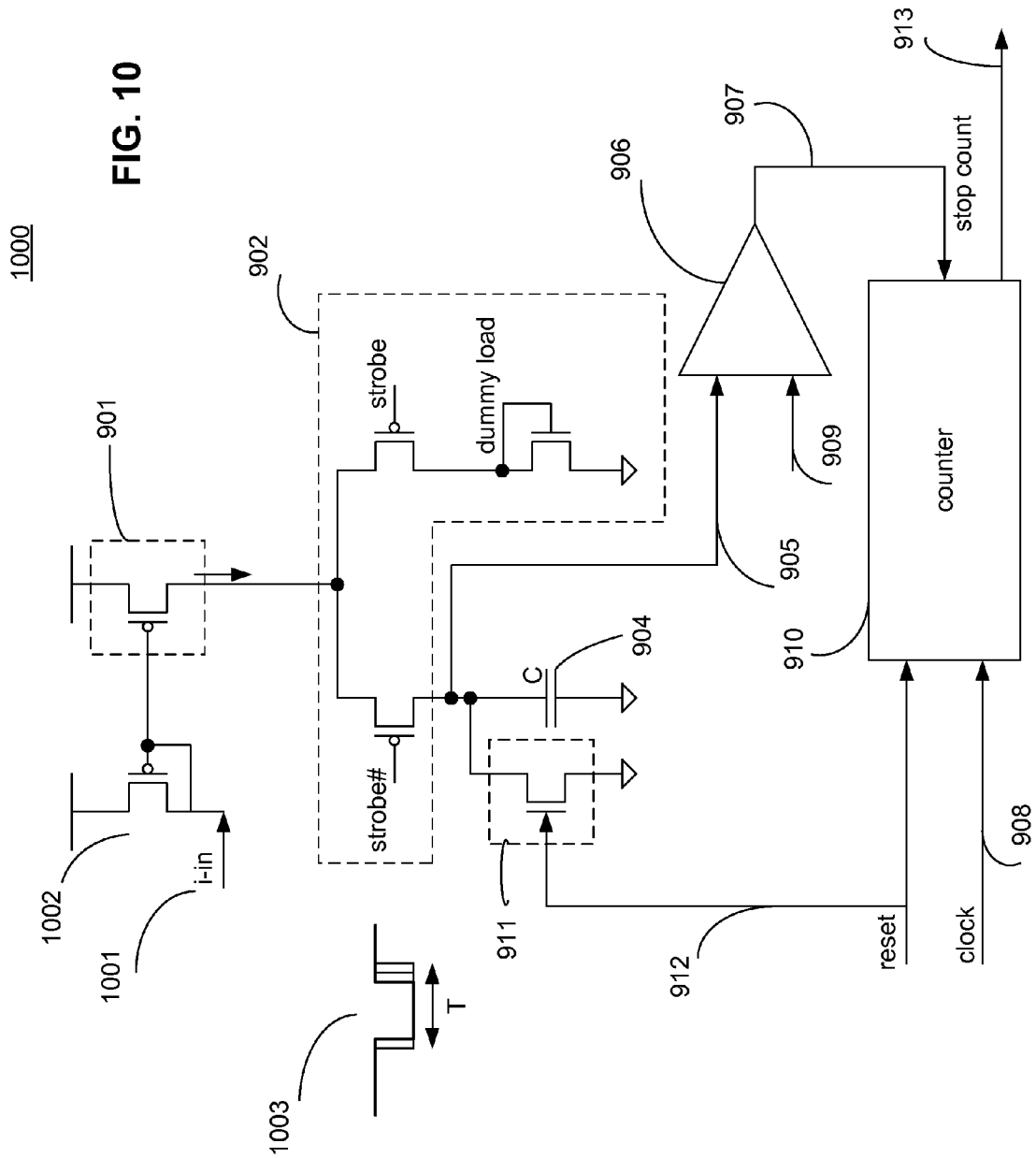
FIG. 10 illustrates a circuit level diagram of the A2D converter for measuring various signal attributes, according to one embodiment of the invention.

FIG. 10 illustrates a circuit level diagram 1000 of the A2D converter 900 for measuring various signal attributes, according to one embodiment of the invention. In one embodiment, current source 901 is implemented as a PMOS transistor with its gate tied to a diode connected PMOS transistor 1002 which forms a current mirror. In one embodiment, the current 1001 to be measured is input to the PMOS transistor 1002. In one embodiment, the device sizes (width and length) of the transistors 901 and 1002 are the same and so the current flowing into the first switch 902 from the current source 901 is equal to the input current 1001.

In one embodiment, the switch 902 comprises PMOS pass gates controlled by strobe# and strobe signals which are represented by signal 903. In one embodiment, the strobe# and strobe signals are clock signals having a frequency which is the same as the frequency of the counter clock signal 908. The term '#' herein refers to an inverse function. For example, strobe# signal is an inverse signal of the strobe signal. In one embodiment, when the A2D converter 900 is configured to measure a time difference (e.g., pulse width or duty cycle of a signal), then a signal similar to 1003 is input as the strobe signal. In one embodiment, a dummy load (diode connected NMOS transistor) is coupled to one of the PMOS transistors of the switch 902 to mimic the load of the second switch 911. In one embodiment, the second switch 911 is implemented as an NMOS transistor which is operable to discharge the integrating capacitor 904 in response to a reset signal 912.

Figure 11:
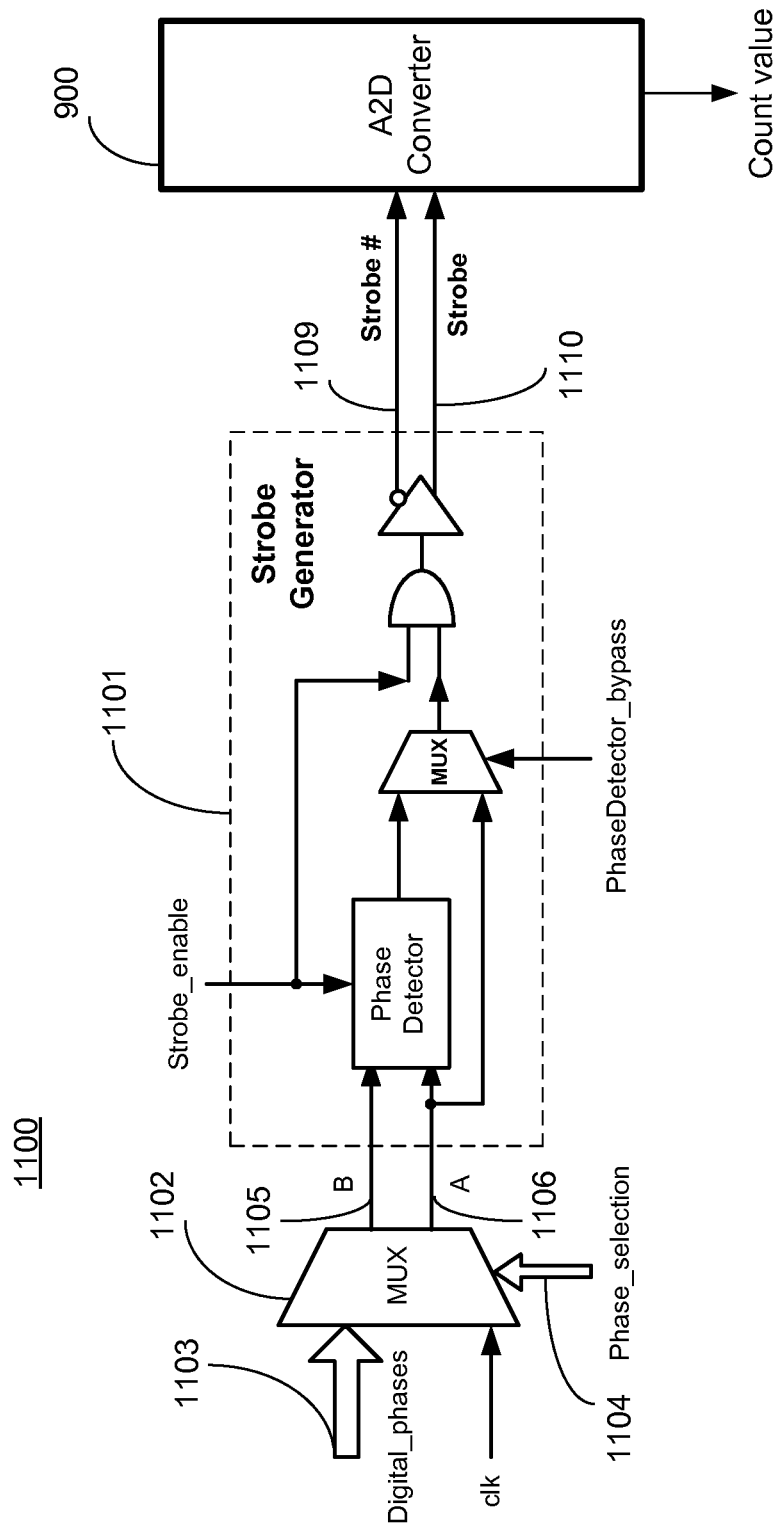
FIG. 11 illustrates components for providing inputs to the A2D converter for measuring various digital and analog signal attributes, according to one embodiment of the invention.

FIG. 11 illustrates components 1100 for providing inputs to the A2D converter 900 for measuring various signal attributes, according to one embodiment of the invention. In one embodiment, a multiplexer 1102 provides selective signals 1109 and 1110 via a strobe generator 1101 to the A2D converter 900. The signals 1109 and 1110 are collectively shown as signal 903 in FIG. 9B.

Referring back to FIG. 11, in one embodiment the multiplexer receives the signals for measurement 1103 and a clock signal. In one embodiment, the multiplexer outputs signals 1105 and 1106 in response to a select signal 1104. In one an embodiment, the strobe generator 1101 compares the phases of the signals 1105 and 1106 and generates the strobe and strobe# signals 1109 and 1110 respectively. In such an embodiment, the A2D converter 900 outputs a count value 913 which represents the phase difference between the signals 1109 and 1110.

In one embodiment, the phase detector of the strobe generator 1101 is bypassed when the A2D converter 900 is being used to measure a phase of the strobe signal 1109, or the pulse width of the strobe signal 1109, wherein the strobe signal 1109 is one of the signals for measurement 1103.

Figure 12:
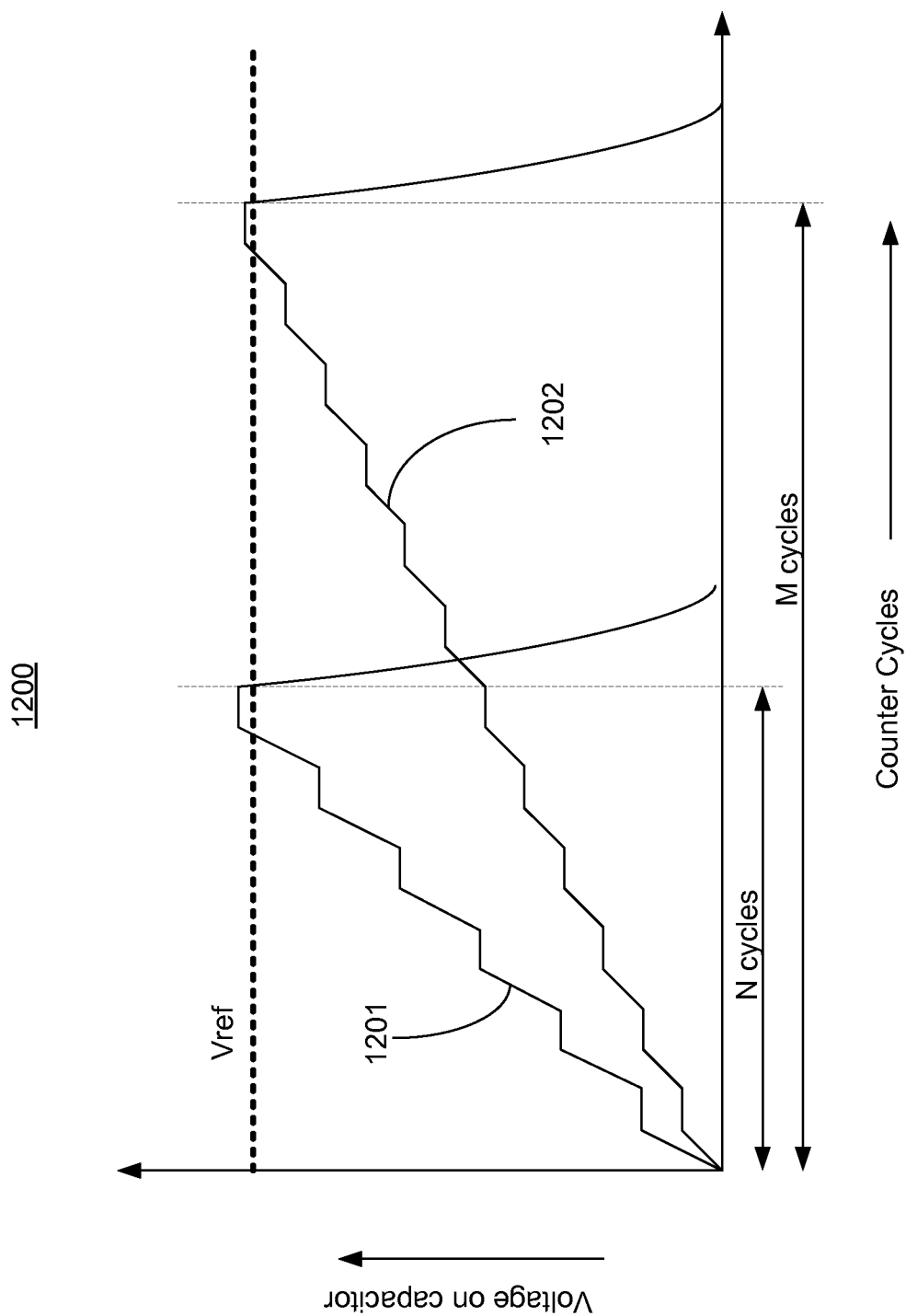
FIG. 12 illustrates a waveform of a capacitor of the A2D converter for measuring various signal attributes, according to one embodiment of the invention.

FIG. 12 illustrates a graphical plot 1200 of waveforms of the node 905 of the integrating capacitor 904 of the A2D converter 900 with respect to the reference voltage signal 909, according to one embodiment of the invention. The y-axis represents the voltage on the node 905, which is the voltage on the integrating capacitor 904. The x-axis represents the counter value 913 of the counter 910. Waveform 1201 shows a case when the counter begins to count from zero after being discharged through the device 911 in response to the reset signal 912. When the voltage on the node 905 crosses the reference voltage signal 909, the output 907 of the comparator 906 trips. In response to the output 907 tripping, the node 909 is discharged. Waveform 1202 illustrates a case when the node 909 take a longer time to charge to reach the level of the reference voltage signal 909 relative to the time it takes the waveform 1201 to charge.

Figure 13:
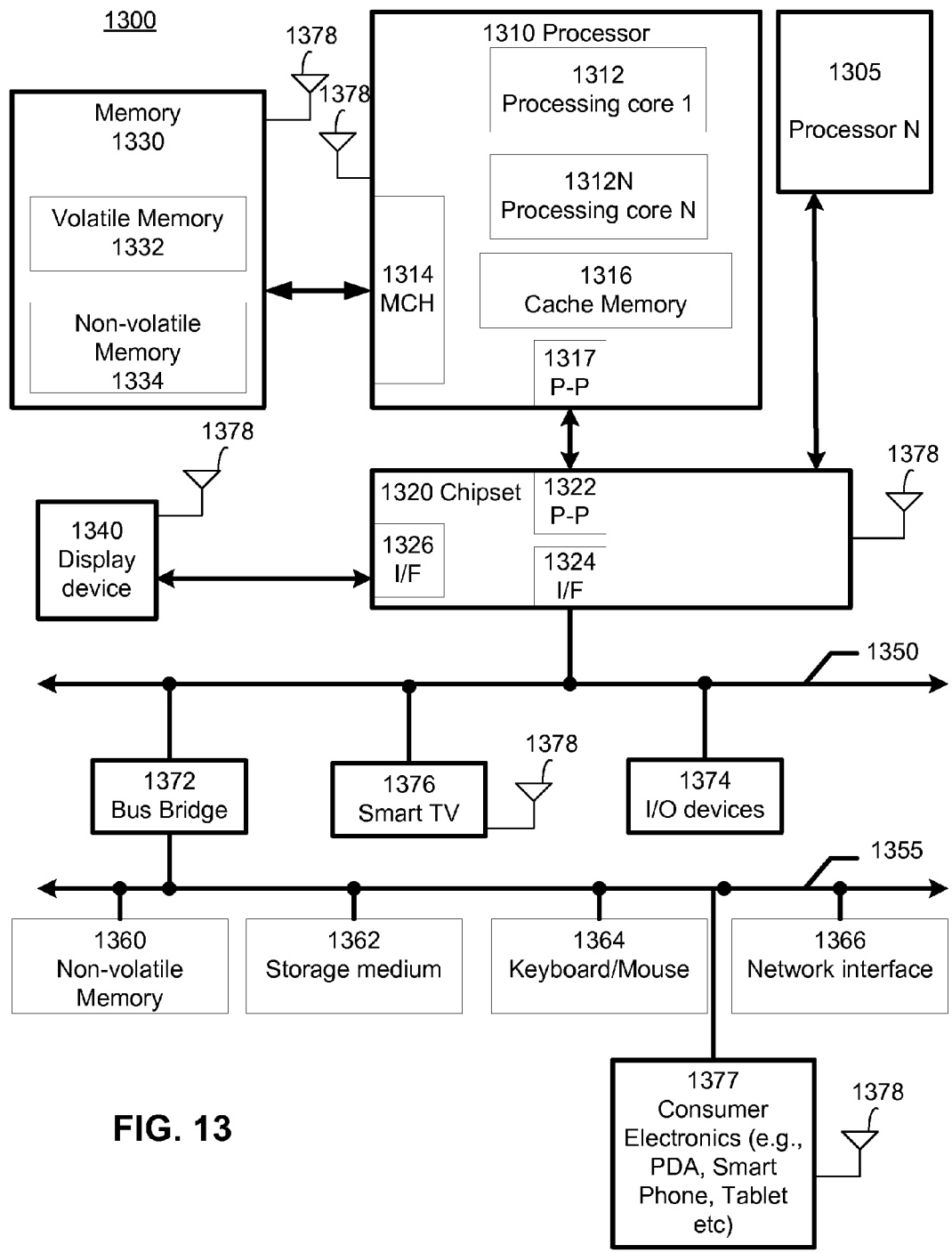
FIG. 13 illustrates a system level diagram having the adjustment unit for adjusting voltage swings and duty cycle of signals, and the A2D converter, according to one embodiment of the invention.

FIG. 13 illustrates a system level diagram having the adjustment unit for adjusting voltage swings and duty cycle of signals, and the A2D converter, according to one embodiment of the invention. FIG. 13 also includes a machine-readable storage medium to execute computer readable instructions to perform the methods of various embodiments. Elements of embodiments are also provided as a machine-readable medium (e.g., 1362) for storing the computer-executable instructions (e.g., instructions to implement the flowcharts of FIGS. 7-8). The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

In one embodiment, the system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 1300 implements the methods disclosed herein and may be a system on a chip (SOC) system.

In one embodiment, the processor 1310 has one or more processing cores 1312 and 1312N, where 1312N represents the Nth processor core inside the processor 1310 where N is a positive integer. In one embodiment, the system 1300 includes multiple processors including 1310 and 1305, where processor 1305 has logic similar or identical to logic of processor 1310. In one embodiment, the processing core 1312 includes, but is not limited to, pre-fetch logic to fetch instructions, decode logic to decode the instructions, execution logic to execute instructions and the like. In one embodiment, the processor 1310 has a cache memory 1316 to cache instructions and/or data of the system 1300. In another embodiment of the invention, the cache memory 1316 includes level one, level two and level three, cache memory, or any other configuration of the cache memory within the processor 1310.

In one embodiment, processor 1310 includes a memory control hub (MCH) 1314, which is operable to perform functions that enable the processor 1310 to access and communicate with a memory 1330 that includes a volatile memory 1332 and/or a non-volatile memory 1334. In one embodiment, the MCH 1314 is the same as the memory controller 101 of the embodiments discussed herein.

In one embodiment, the processor 1310 is operable to communicate with the memory 1330 and a chipset 1320. In one embodiment, the processor 1310 is also coupled to a wireless antenna 1378 to communicate with any device configured to transmit and/or receive wireless signals. In one embodiment, the wireless antenna interface 1378 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 1332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1334 includes, but is not limited to, flash memory, phase change memory (PCM), read-only memory (ROM), electrically erasable programmable read-only memory (EEPROM), or any other type of non-volatile memory device.

The memory 1330 stores information and instructions to be executed by the processor 1310. In one embodiment, memory 1330 may also store temporary variables or other intermediate information while the processor 1310 is executing instructions. In one embodiment, chipset 1320 connects with processor 1310 via Point-to-Point (PtP or P-P) interfaces 1317 and 1322. In one embodiment, chipset 1320 enables processor 1310 to connect to other modules in the system 1300. In one embodiment of the invention, interfaces 1317 and 1322 operate in accordance with a PtP communication protocol such as the Intel® QuickPath Interconnect (QPI) or the like.

In one embodiment, the chipset 1320 is operable to communicate with the processor 1310, 1305, display device 1340, and other devices 1372, 1376, 1374, 1360, 1362, 1364, 1366, 1377, etc. In one embodiment, the chipset 1320 is also coupled to a wireless antenna 1378 to communicate with any device configured to transmit and/or receive wireless signals.

In one embodiment, chipset 1320 connects to a display device 1340 via an interface 1326. In one embodiment, the display 1340 includes, but is not limited to, liquid crystal display (LCD), plasma, cathode ray tube (CRT) display, or any other form of visual display device. In one embodiment of the invention, processor 1310 and chipset 1320 are merged into a single SOC. In addition, the chipset 1320 connects to one or more buses 1350 and 1355 that interconnect various modules 1374, 1360, 1362, 1364, and 1366. In one embodiment, buses 1350 and 1355 may be interconnected together via a bus bridge 1372 if there is a mismatch in bus speed or communication protocol. In one embodiment, chipset 1320 couples with, but is not limited to, a non-volatile memory 1360, a mass storage device(s) 1362, a keyboard/mouse 1364, and a network interface 1366 via interface 1324, smart TV 1376, consumer electronics 1377, etc.

In one embodiment, the mass storage device 1362 includes, but is not limited to, a solid state drive, a hard disk drive, a universal serial bus flash memory drive, or any other form of computer data storage medium. In one embodiment, network interface 1366 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HomePlug AV (HPAV), Ultra Wide Band (UWB), Bluetooth, WiMAX, or any form of wireless communication protocol.

While the modules shown in FIG. 13 are depicted as separate blocks within the system 1300, the functions performed by some of these blocks may be integrated within a single semiconductor circuit or may be implemented using two or more separate integrated circuits. For example, although the cache memory 1316 is depicted as a separate block within the processor 1310, the cache memory 1316 can be incorporated into the processor core 1312 respectively. In one embodiment, the system 1300 may include more than one processor/processing core in another embodiment of the invention.

Reference in the specification to an "embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. One such alternative for the A2D converter is shown by FIG. 14.

FIG. 14 illustrates transistor level components 1400 of the A2D converter 900, according to another embodiment of the invention. For purposes of not repeating the description of components discussed with previous figures, only the main differences between FIG. 10 and FIG. 14 are discussed. In this alternative embodiment, the A2D converter 900 provides two circuit paths for measuring current levels input at 1101. In one embodiment, when the to-be measured current through 1101 is a negative current, then switch 1401 is closed while switch 1402 is open (i.e., no current flows through transistors M3 and M4). In one embodiment, when the to-be measured current through 1101 is a positive current then switch 1401 is open while switches 1402 are closed ((i.e., current flows through transistors M3 and M4).

In one embodiment, when the A2D converter 900 is operable to measure voltage at node 905, switch 1405 is closed and fixed bias voltage is supplied to transistor M2 via an analog multiplexer 1407. In one embodiment, fixed bias is also provided to transistor M5. In such an embodiment, the signals 1110 and 1109 toggle at the same frequency as the frequency of the counter 910. In one embodiment, when the A2D converter 900 is operable to measure time different e.g., pulse width of the strobe signal 1110, then switch 1405 is open and fixed bias voltage is supplied to transistor M2 via the analog multiplexer 1407. In the above embodiments, signal 1406 is used to discharge the node 905 after the comparator 906 trips. In one embodiment, signals 1401, 1402, 1403, 1404, and 1406 are generated by a finite state machine (not shown).

The embodiments of the invention are intended to embrace all such alternatives, modifications, and variations as to fall within the broad scope of the appended claims.

We claim:

1. An analog-to-digital (A2D) converter comprising:
a capacitor with first and second terminals;
a comparator to compare a voltage signal on the first terminal with a reference voltage signal level;
a current source to charge or discharge the capacitor;
a first switch, coupled between the current source and the first terminal, the first switch to control the speed of charging or discharging the capacitor; and
wherein the current source and the first switch are configurable between separate operating modes to control the charging and discharging of the capacitor such that the charge on the capacitor represents one of a current input that biases the current source, a pulse width of a signal input to the first switch, and a voltage applied as pre-charged voltage to the first terminal of the capacitor.

2. The A2D converter of claim 1 further comprises a phase detector to compare phases of two signals and to generate a signal to control the switching speed of the first switch.

3. The A2D converter of claim 2 further comprises a multiplexer to generate the two signals by selecting the two signals from multiple signals including phase delayed signals and clock signals.

4. The A2D converter of claim 1 further comprises a counter, wherein the counter is coupled to the comparator to receive an output of the comparator and to count up or down in response to a reset signal, where the counter to output a signal which represents one of:
a current input to the current source;
a pulse width of a signal input to the first switch; and
a voltage, on the first terminal of the capacitor, relative to a reference voltage.

5. The A2D converter of claim 4 further comprises a second switch to discharge the capacitor by connecting the first terminal to a ground terminal in response to the reset signal.

6. The A2D converter of claim 1, wherein the second terminal of the capacitor is connected to a ground terminal, and wherein the comparator is operable to cancel offset.

7. The A2D converter of claim 1, wherein the current source is coupled to a current mirror for providing a current to charge the capacitor, and wherein current source is operable to provide a fixed current for charging the capacitor when the first switch receives a time domain signal having a pulse width.

8. The A2D converter of claim 1, wherein the first switch comprises PMOS transistors controlled by the signal and the inverse signal generated by the strobe generator and a dummy load coupled to one of the PMOS transistors.

9. The A2D converter of claim 1, wherein the comparator is operable to provide the counter with tripping signal by cancelling offset.

10. The A2D converter of claim 1, wherein the comparator receives a clock signal for sampling the comparator output to the counter.

11. The A2D converter of claim 1 further comprising a counter to count a number of cycles that occurs before the voltage signal on the first terminal reaches the reference voltage.

12. A system comprising:
a memory; and
a processor coupled to the memory, the processor having an analog-to-digital converter (ADC) including:
a capacitor with first and second terminals;
a comparator to compare a voltage signal on the first terminal with a reference voltage signal level;
a current source to charge or discharge the capacitor;
a first switch, coupled between the current source and the first terminal, the first switch to control the speed of charging or discharging the capacitor; and
a wireless interface for allowing the processor to communicate with another devices;
wherein the current source and the first switch are configurable between separate operating modes to control the charging and discharging of the capacitor such that the charge on the capacitor represents one of a current input that biases the current source, a pulse width of a signal input to the first switch, and a voltage applied as pre-charged voltage to the first terminal of the capacitor.

13. The A2D converter of claim 12 further comprises a phase detector to compare phases of two signals and to generate a signal to control the switching speed of the first switch.

14. The system of claim 13, wherein the A2D converter further comprises a multiplexer to generate the two signals by selecting the two signals from multiple signals including phase delayed signals and clock signals.

15. The system of claim 12 further comprises a counter, wherein the counter is coupled to the comparator to receive an output of the comparator and to count up or down in response to a reset signal, where the counter to output a signal which represents one of:
a current input to the current source;
a pulse width of a signal input to the first switch; and
a voltage, on the first terminal of the capacitor, relative to a reference voltage.

16. The system of claim 15, wherein the A2D converter further comprises a second switch to discharge the capacitor in response to the reset signal.

17. The system of claim 12, wherein the second terminal of the capacitor is connected to a ground terminal, and wherein the comparator is operable to cancel offset.

18. The system of claim 12, wherein the current source is coupled to a current mirror for providing a current to charge the capacitor, and wherein current source is operable to provide a fixed current for charging the capacitor when the first switch receives a time domain signal having a pulse width.

* * * * *